(12) United States Patent
Bowen et al.

(10) Patent No.: US 10,509,172 B2
(45) Date of Patent: Dec. 17, 2019

(54) TUNABLE OPTICAL DEVICE

(71) Applicant: THE UNIVERSITY OF QUEENSLAND, St Lucia, Queensland (AU)

(72) Inventors: Warwick Bowen, Fairfield (AU); Christopher Baker, St Lucia (AU)

(73) Assignee: The University of Queensland, St Lucia, Queensland (AU)

( * ) Notice: Subject to any disclaimer, the term of this patent is extended or adjusted under 35 U.S.C. 154(b) by 0 days.

(21) Appl. No.: 15/745,837

(22) PCT Filed: Jul. 20, 2016

(86) PCT No.: PCT/AU2016/050644
§ 371 (c)(1),
(2) Date: Jan. 18, 2018

(87) PCT Pub. No.: WO2017/011872
PCT Pub. Date: Jan. 26, 2017

(65) Prior Publication Data
US 2018/0224606 A1 Aug. 9, 2018

(30) Foreign Application Priority Data
Jul. 20, 2015 (AU) ............................... 2015902876

(51) Int. Cl.
*G02B 6/293* (2006.01)
*G02B 6/27* (2006.01)
*H01S 5/22* (2006.01)
*H01S 5/022* (2006.01)

(52) U.S. Cl.
CPC ......... *G02B 6/2934* (2013.01); *G02B 6/2726* (2013.01); *G02B 6/29343* (2013.01); *G02B 6/29395* (2013.01); *H01S 5/02284* (2013.01)

(58) Field of Classification Search
CPC ............ G02B 6/293; G02B 6/27; H01S 5/022
USPC .......................................... 385/14
See application file for complete search history.

(56) References Cited

U.S. PATENT DOCUMENTS

| 4,135,108 A | * | 1/1979 | Besson | ................ | H03H 9/1014 310/344 |
| 6,341,184 B1 | * | 1/2002 | Ho | ........................ | G02F 1/2257 385/1 |
| 6,839,488 B2 | * | 1/2005 | Gunn | ..................... | B82Y 20/00 372/20 |
| 7,751,655 B2 | * | 7/2010 | Fattal | ..................... | B82Y 20/00 385/2 |

(Continued)

FOREIGN PATENT DOCUMENTS

| WO | WO 2009/075684 | 6/2009 |
| WO | WO 2012/173620 | 12/2012 |

OTHER PUBLICATIONS

International Search Report for PCT/AU2016/050644, dated Sep. 23, 2016, 8 pages.

*Primary Examiner* — Kaveh C Kianni
(74) *Attorney, Agent, or Firm* — Nixon & Vanderhye P.C.

(57) ABSTRACT

A tunable optical device comprising an optical ring cavity and one or more pairs of electrodes for capacitive actuation of the optical tuning. Applying a potential difference to the electrodes applies a capacitive force to the optical ring cavity which changes the optical resonance frequency. The device can be used as a binary optical switch.

14 Claims, 5 Drawing Sheets

(56) References Cited

U.S. PATENT DOCUMENTS

| | | | | |
|---|---|---|---|---|
| 7,853,108 B2* | 12/2010 | Popovic | | G02B 6/107 385/126 |
| 7,903,909 B2* | 3/2011 | Popovic | | G02B 6/10 385/27 |
| 8,032,027 B2* | 10/2011 | Popovic | | G02B 6/12007 398/82 |
| 8,483,521 B2* | 7/2013 | Popovic | | G02B 6/29338 385/15 |
| 8,582,929 B2* | 11/2013 | Yi | | G02F 1/2257 385/10 |
| 8,655,114 B2* | 2/2014 | Popovic | | G02B 6/12007 385/1 |
| 8,849,075 B2* | 9/2014 | Painter | | G02B 26/001 385/129 |
| 2005/0058415 A1* | 3/2005 | Lee | | B82Y 10/00 385/122 |
| 2006/0056760 A1* | 3/2006 | Djordjev | | G02B 6/12007 385/15 |
| 2008/0205461 A1* | 8/2008 | Henrichs | | H01S 5/18391 372/29.023 |
| 2008/0240180 A1* | 10/2008 | Matsui | | H01S 5/06258 372/26 |
| 2009/0060526 A1* | 3/2009 | Matsui | | G02B 6/12007 398/185 |
| 2009/0115416 A1* | 5/2009 | White | | G01N 24/08 324/316 |
| 2010/0030167 A1* | 2/2010 | Thirstrup | | A61F 5/445 604/318 |
| 2012/0301069 A1* | 11/2012 | Goldring | | B82Y 20/00 385/2 |
| 2014/0230547 A1* | 8/2014 | El-Gamal | | G01C 19/5698 73/504.12 |
| 2015/0212386 A1* | 7/2015 | Patel | | G02B 6/132 385/3 |
| 2015/0214425 A1* | 7/2015 | Taylor | | H01S 5/0421 385/14 |
| 2016/0069686 A1* | 3/2016 | Lee | | G01C 19/661 356/460 |
| 2017/0040487 A1* | 2/2017 | Alloatti | | H01L 31/1105 |
| 2018/0284561 A1* | 10/2018 | Phare | | G02F 1/035 |

\* cited by examiner

FIG 13
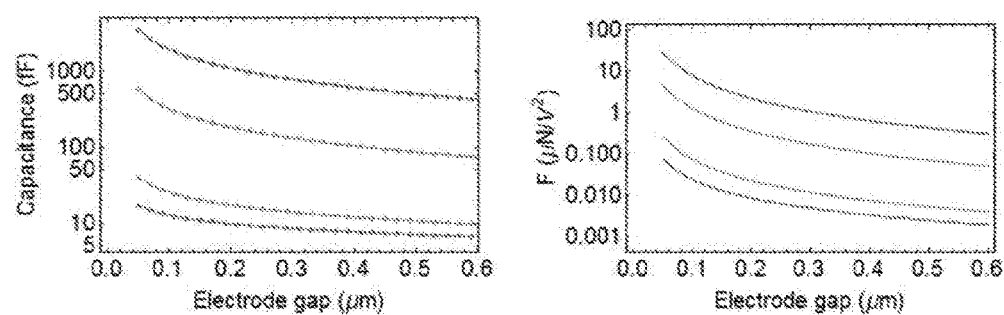
FIG 14
FIG 15
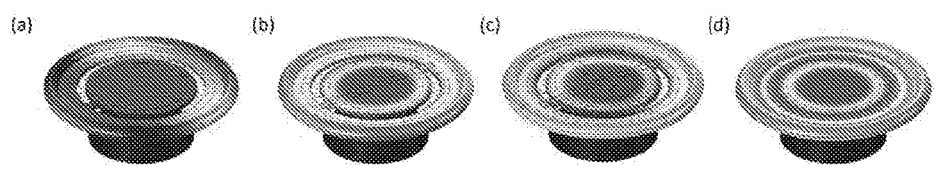
FIG 16

TUNABLE OPTICAL DEVICE

This application is the U.S. national phase of International Application No. PCT/AU2016/050644 filed 20 Jul. 2016, which designated the U.S. and claims priority to AU Patent Application No. 2015902876 filed 20 Jul. 2015, the entire contents of each of which are hereby incorporated by reference.

FIELD OF THE INVENTION

The present invention relates to the field of optical cavities. More particularly, the invention relates to a method and fabrication technique to tune the resonance frequencies of optical cavities.

BACKGROUND TO THE INVENTION

Optical cavities only interact with certain narrow, regularly spaced wavelengths of light called optical resonances. The ability to control ('tune') the wavelength of these resonances is important for a wide variety of applications. For example, a laser beam can only couple to a cavity if its wavelength precisely matches one of the resonances, and two distinct optical cavities cannot interact with each other unless they share a common resonance wavelength. Important capabilities include the ability to tune fast, with high efficiency, and over a wide frequency range.

For many optical cavities, and in particular for miniaturized cavities, the main currently used method to tune the resonance frequencies relies on thermal heating, whereby heating the resonator changes its size and refractive index and therefore shifts the optical resonances. However, thermal tuning is relatively slow, has low efficiency and, depending on the material, can be only operable over a narrow range due to damage to the optical cavity caused by very high or very low temperatures.

Tunability is important for a particular class of optical cavities termed ring cavities. In some known prior art devices the optical field may be confined in whispering gallery modes (WGM) within a micron-scale disk fabricated on a chip. In our earlier published international patent application WO2015/039171 we describe a related device that uses an optical microcavity as the basis for an optical magnetometer. Various optical cavities are described in WO2015/039171, the content of which is incorporated herein by reference.

The range of applications for tunable optical microcavities is quite broad, including biological, nanoparticle, and magnetic field sensing; on-chip precision clocks for GPS and other timing applications; and on-chip lasers, optical interconnects, and integrated optical delay lines for optical components in computation and communication. All of these applications are currently constrained by the lack of a fast, easy, efficient, and scalable way to tune the optical resonators; and typically rely instead on the tuneability of the laser sources themselves, which precludes the use of arrays of microresonators, and requires large and expensive laser sources which are not compatible with fully integrated solutions. Furthermore the emerging field of on-chip photonic circuitry will benefit from optical tuneability as well if networks of resonators are to be linked.

SUMMARY OF THE INVENTION

In one form, although it need not be the only or indeed the broadest form, the invention resides in a tunable optical device comprising:

an optical ring cavity having at least an optical resonance frequency; and electrodes forming a capacitor;

wherein applying a potential difference between the electrodes generates a capacitive force applied to the optical ring cavity that shifts the optical resonance frequency.

The optical ring cavity is suitably a circular or elliptical cavity where the light circulates by grazing incidence total internal reflection around the perimeter of the cavity. The optical ring cavity may be a microdisk with a diameter in the range of a few micrometers to a few centimetres. Preferred dimensions are a diameter from about 5 microns to about 30 millimetres, but more preferably a diameter in the range of about 60 micron to about 16 millimetres.

Alternatively, the optical ring cavity may be a rectangular resonator, preferably square, where light circulates by reflection from dielectric coatings on the surface of the resonator.

The electrodes may be selected from gold, aluminium, indium tin oxide, or other materials demonstrating conductive properties.

There may be a single pair of electrodes or a plurality of pairs of electrodes. The electrodes may be designed for large capacitance by coating with a high dielectric material. In the case of multiple pairs of electrodes they may be inter-digitated. By inter-digitated it is meant that the multiple electrodes are arranged in an array of alternating polarity.

The electrodes may be deposited onto the optical cavity. Preferably the electrodes are deposited adjacent or in a slot formed in the optical cavity. The slot may be filled with air or a material with a higher dielectric constant.

In a yet further form the invention resides in a method of fabricating an optical ring cavity with capacitive tuning including the steps of:

forming an optical ring cavity;
locating electrodes on the optical ring cavity to form a capacitor; and
heating the cavity to reflow, and therefore smooth, its surface, without damaging the electrodes.

The dielectric of the capacitor may be formed in the material of the optical ring cavity by injecting ions into the surface of the material, by removing or replacing material of the optical ring cavity or by forming the optical ring cavity from a composite material. The dielectric of the capacitor may suitably be air.

The optical ring cavity structure may be formed by one or more of: photolithography; focussed ion beam milling; electron beam lithography;

diamond turning; laser ablation, or drilling.

The electrodes may be formed by one or more of: physical vapour deposition; sputtering; chemical vapour deposition; pulsed laser deposition; metal organic molecular beam deposition; or spray pyrolysis.

In a yet further form the invention may reside in a fabrication technique to reflow an optical ring cavity structure with electrodes comprising:
under-etching the optical ring cavity in two stages;
stopping the first under-etching stage before the material underneath the electrodes is etched away;
applying heating with a $CO_2$ laser to melt the material of the optical ring cavity after the first under-etching stage, with the thermal conductivity of the material remaining underneath the electrodes preventing electrode heating and damage; under-etching the optical ring cavity in a second stage to free the outer part of the cavity from the material underneath it and allow it to contract and expand upon application of a capacitive force.

Further features and advantages of the present invention will become apparent from the following detailed description.

BRIEF DESCRIPTION OF THE DRAWINGS

To assist in understanding the invention and to enable a person skilled in the art to put the invention into practical effect, preferred embodiments of the invention will be described by way of example only with reference to the accompanying drawings, in which:

FIG. 13 shows a simulation of the electromagnetic energy density around the electrodes of the tunable optical device of FIG. 9 with various dielectric coatings;

FIG. 14 is a plot of total capacitance as a function of electrode gap for the arrangement of FIG. 13;

FIG. 15 is a plot of force per volt as a function of electrode gap for the arrangement of FIG. 13;

FIG. 16 displays a variety of pedestal designs;

DETAILED DESCRIPTION OF THE INVENTION

Figure 1:
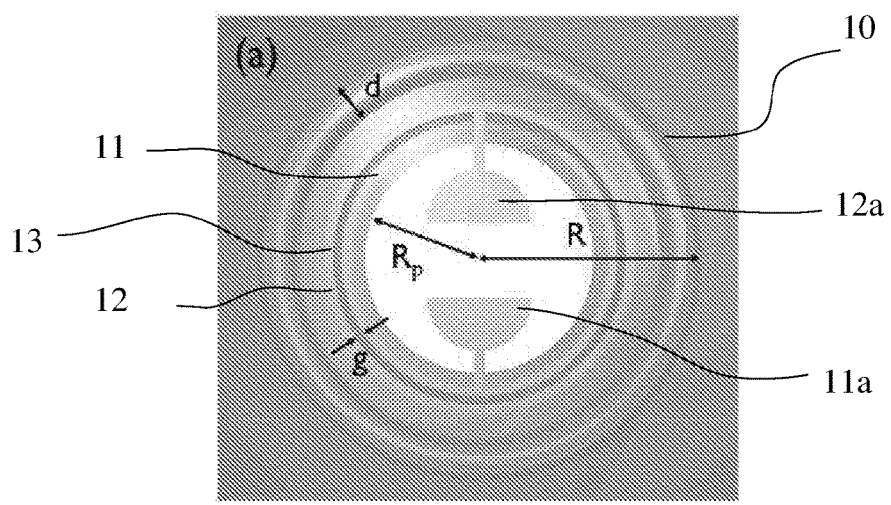
FIG. 1 shows a first embodiment of a tunable optical device.

Embodiments of the present invention reside primarily in a method and fabrication technique to tune the resonance frequencies of optical cavities. Accordingly, the elements have been illustrated in concise schematic form in the drawings, showing only those specific details that are necessary for understanding the embodiments of the present invention, but so as not to obscure the disclosure with excessive detail that will be readily apparent to those of ordinary skill in the art having the benefit of the present description.

In this specification, adjectives such as first and second, left and right, and the like may be used solely to distinguish one element or action from another element or action without necessarily requiring or implying any actual such relationship or order. Words such as "comprises" or "includes" are intended to define a non-exclusive inclusion, such that a process, method, article, or apparatus that comprises a list of elements does not include only those elements but may include other elements not expressly listed, including elements that are inherent to such a process, method, article, or apparatus.

Referring to FIG. 1 there is shown a top view of a first embodiment of an optical ring cavity 10 with capacitive electrodes 11, 12 used to provide the capacity for voltage tuning of its optical resonance frequencies. The device comprises an optical ring cavity having a circular slot 13 fabricated in it and electrodes 11, 12 deposited on either side of the slot 13. The optical ring cavity is a toroid, but the invention is not limited to this shape.

By ring cavity is meant that the cavity has a configuration in which optical radiation circulates unidirectionally. Most commonly the ring cavity will be circular or elliptical but may also be rectangular, triangular, or some other shape that permits optical radiation to circulate within the cavity and for the radiation to be coupled in and out at the same, or about the same, position.

The relevant dimensions shown in FIG. 1 are the toroid major radius R, toroid minor diameter d, electrode gap g and undercut silicon pedestal radius Rp. Electrical connection to inner electrode 11 is provided by tab 11a and electrical connection to outer electrode 12 is provided by tab 12a.

By way of example only, the optical cavity may be a microdisk with a diameter in the range of a few micrometers to a few centimetres. The inventors have found that suitable dimensions are a diameter from about 5 microns to about 30 millimetres, but speculate that a diameter in the range of about 10 micron to about 0.5 millimetres is most suitable.

Figure 2:
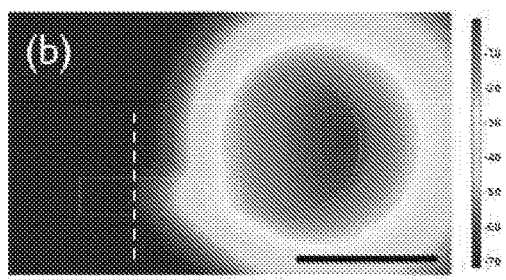
FIG. 2 shows an FEM simulation of the electro-magnetic energy distribution in the tunable optical device of FIG. 1.
Figure 3:
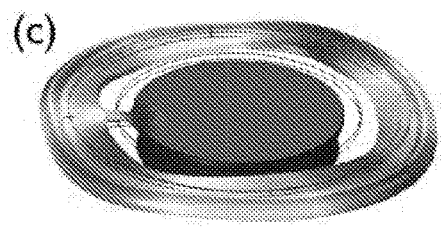
FIG. 3 shows an FEM simulation of the radial breathing mode-like mechanical mode in the tunable optical device of FIG. 1.

FIG. 2 shows a simulation of one optical whispering gallery mode within the device. It is a FEM (Finite Element Method) simulation of a (p=1, m=280) WGM at 1550 nm, showing the electro-magnetic energy density in log scale. The black scale bar corresponds to 8 microns. FIG. 3 shows a simulation of a mechanical eigenmode of motion of the device which couples efficiently to the capacitive actuation. It shows an FEM model of the radial breathing mode-like mechanical mode at 18 MHz. As can be seen from FIG. 2 and FIG. 3, an attractive force generated between the electrodes 11, 12 will affect the radial breathing mode and thus change the optical resonance. This effect can be used for resonantly enhanced tuning.

Figure 4:
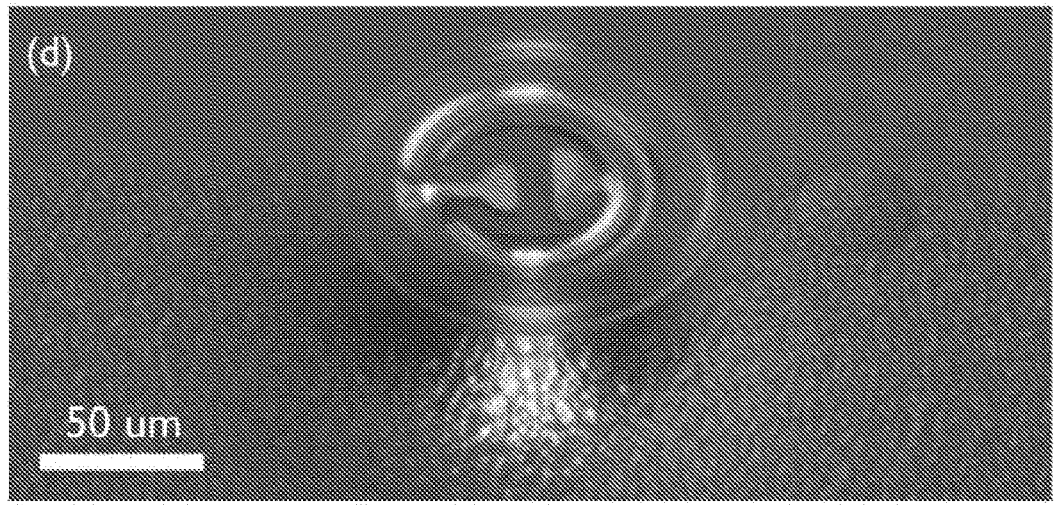
FIG. 4 shows an optical microscope side view of the tunable optical device of FIG. 1.

The structure of the tunable optical microcavity is shown in FIG. 4. FIG. 4 is an optical microscope side-view of a fabricated device. This image was obtained by combining 10 individual images taken at different focus to overcome the shallow depth of field (focus stacking). The optical microcavity 10 has a slot 13 cut into it but leaving a bridge to join the outer ring with the central pedestal. The device may be formed on a silicon wafer using a similar process to the process described in WO2015/039171.

Figure 5:
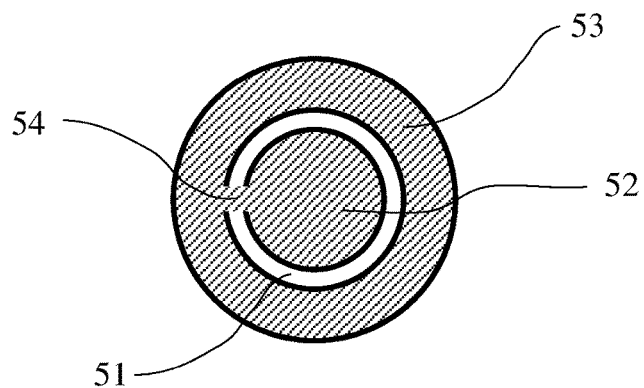
FIG. 5 is a sketch of a top view of the tunable optical device of FIG. 1.

To better assist with understanding the structure of the tunable optical cavity a simple sketch is provided as FIG. 5. A silica disc comprising a slot 51 is fabricated, so that after under-etching a portion of the underlying material, an air gap is formed between a central portion 52 and an outer portion 53 (where the whispering gallery mode resonances are localized). The central portion 52 rests upon a pedestal (not shown). An anchor 54 is left in place to support the outer portion 53. As shown in FIG. 1, electrodes are fashioned either side of the air gap to form a capacitor. When a potential difference is applied across the electrodes opposite charges accumulate on the electrodes and generate an attractive force, thus appling strain to the outer portion 53 and changing the optical resonance of the whispering gallery mode.

As will be understood by persons skilled in the art, a capacitor may be formed with a variety of conductive materials. In similar manner the slot may be filled with a dielectric material to increase the capacitive force generated. This is explained in more detail below. It will also be clear that the invention is not limited to a disc but may be applied to other optical cavities, such as those shown in WO2015/039171.

The capacitive force (F) generated may be calculated using:

$$F = \frac{1}{2}\frac{dC(x)}{dx}V^2 \quad (1)$$

where C(x) is the position dependent capacitance formed by the two capacitor plates. It will be noted that F scales with the square of the applied voltage. It will also be appreciated that the capacitance will increase as the distance between the plates decreases and as the length of the plates increases. Thus a greater capacitive force can be applied if larger electrodes can be used and/or the spacing between the electrodes is made as small as possible.

In one embodiment (not shown) a capacitor may be separately formed to fit in the slot 51. The capacitor may have relatively large plates that extend above and below the limits of the slot and may have a preferred dielectric material. The capacitor is bonded into the slot as part of the fabrication process for the tunable optical cavity.

The optical resonance frequencies of the optical cavity 10 are tuned by applying a bias voltage between the electrodes 11, 12. This applies a capacitive force to the structure of the device, deforming it. Since the optical resonance frequencies depend on the size and refractive index of the device, and the deformation alters these properties, the bias voltage results in a change in the optical resonance frequencies of the device. The magnitude of the change in optical resonance frequencies depends on the level of applied voltage, the material properties of the device, and the capacitance between the electrodes. The material properties of the device and the capacitance between the electrodes may both be optimised in a variety of ways to maximize the frequency shift. For instance, by using inter-digitated electrodes, or coating the electrodes with a high dielectric constant material, as described below.

Figure 6:
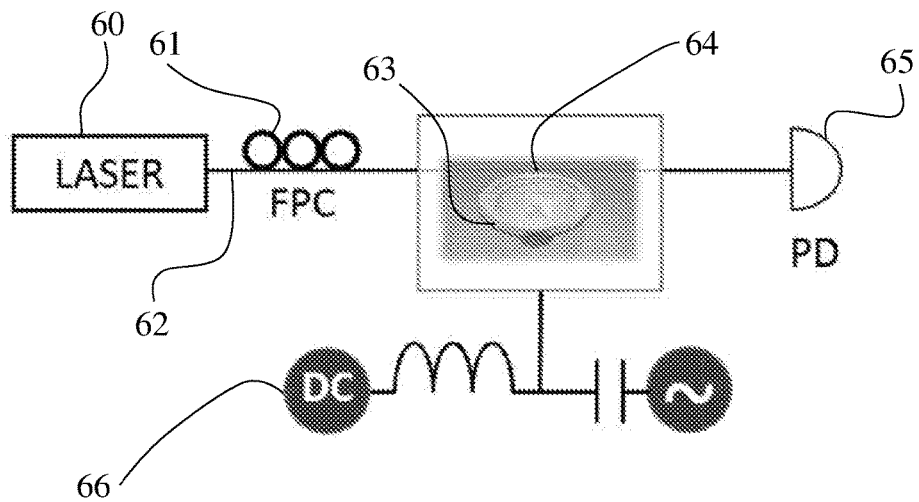
FIG. 6 is a schematic demonstrating capacitive resonance tuning of the tunable optical device of FIG. 1.
Figure 7:
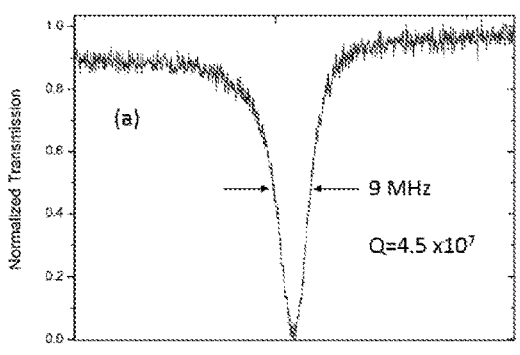
FIG. 7 shows the experimentally observed optical resonance.
Figure 8:
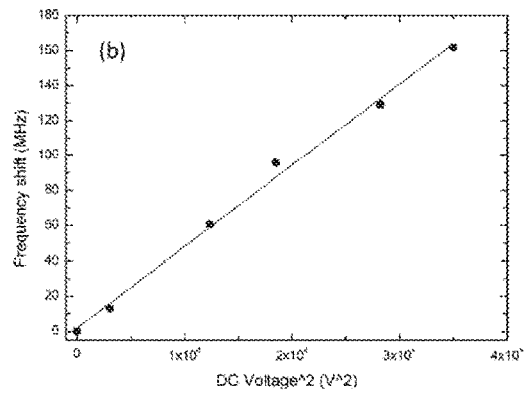
FIG. 8 shows the frequency tuning as a function of applied bias voltage.

Referring to FIG. 6 there is shown a schematic of an experiment used to verify the optical resonance frequency shift generated by an applied bias voltage. A tunable laser 60 generates a laser beam that is coupled to an optical fibre 61. Any tunable laser may be chosen that generates an output at an appropriate frequency for the optical resonances of the optical cavity. The output 62 of the laser is evanescently coupled into the optical cavity 63 via a tapered section 64 of the optical fibre. FPC is a fibre polarization controller. Optical radiation is coupled out of the optical cavity in the same manner. The tapered portion of the optical fibre abuts the optical cavity. Light exiting the optical fibre is detected by a photodiode 65, or other suitable photodetector. Scanning the frequency of the laser allows optical resonances to be located via the absorption they introduce to the optical field as shown experimentally in FIG. 7. Applying a bias voltage 66 to the electrodes shifts the resonance frequencies. These shifts may be tracked by tracking the laser frequency with maximum optical absorption. The frequency shift as a function of bias voltage is displayed experimentally in FIG. 8. It can be seen that, in this implementation, an optical frequency shift of around 4.5 kHz per volt-squared is achieved, verifying that the capacitive tuning technique works.

By way of example, with a 200 V DC bias, a 5V peak to peak (Vpp) AC modulation is sufficient to provide full depth (on/off) modulation for this embodiment. The voltage requirement is further reduced by a factor Qm if the AC drive is resonant with a mechanical mode of quality factor Qm. In deed for an AC drive resonant with, say, an 18 MHz mechanical mode (with Qm=180), only 30 mVpp is required for full depth modulation. This very low voltage optical modulation makes the capacitively driven microtoroids of the invention efficient radio frequency to optical conversion devices.

The experimental arrangement of FIG. 6 shows that the tunable optical cavity 63 can be used as a switch for transmission of the output of the 1550 nm laser 60. That is to say, when the DC bias voltage is not applied a signal will be received at the photodiode 65. When the DC bias voltage is applied the photodiode 65 will not show a signal (the device can also be configured for the converse). This is a binary optical switch. Persons skilled in the art will appreciate how an array of such switches can be configured for optical communication and other applications.

Figure 9:
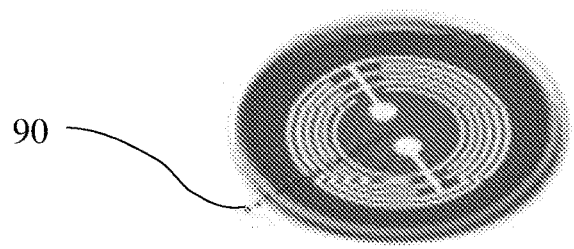
FIG. 9 shows a second embodiment of a tunable optical device.
Figure 10:
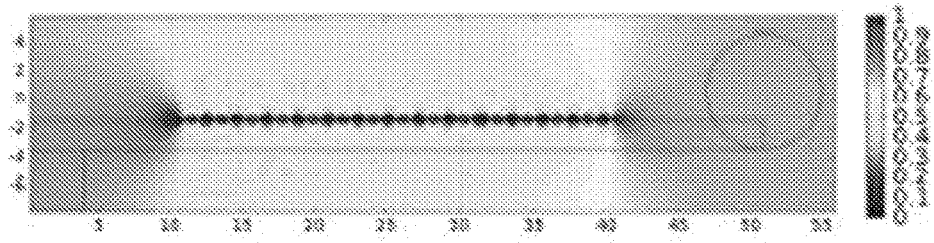
FIG. 10 shows a simulation of the electric field from the electrodes of the tunable optical device of FIG. 9.

As mentioned above, the tuning range can be extended by increasing the capacitive force. One approach to achieve this is to use a plurality of electrode pairs. Referring to FIG. 9, there is shown a possible design for inter-digitated electrodes to improve the frequency shift obtained for a fixed applied bias voltage. The electric field amplitude generated by the bias voltage in this configuration is shown in FIG. 10. FIG. 10 shows a cross-sectional view through the line 90 in FIG. 9. The multiple electrode pairs apply a larger force to the optical cavity thus causing a greater deformation and hence producing a greater tuning range.

Figure 11:
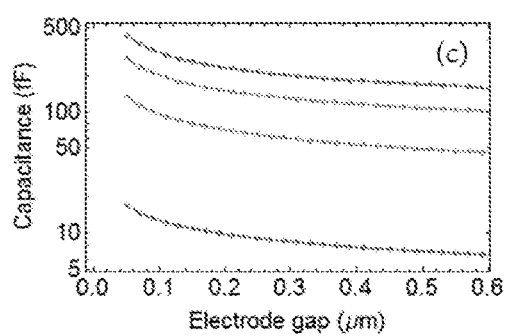
FIG. 11 is a plot of total capacitance as a function of electrode gap for the arrangement of FIG. 10.

Also as mentioned above the capacitive force increases as the gap between the electrodes is reduced. FIG. 11 shows the capacitance as a function of electrode gap for a single electrode pair (as shown in FIG. 1) and for 5, 10 and 15 pairs having a configuration similar to FIG. 9. FIG. 11 shows that the total capacitance increases with the number of inter-digitated electrode pairs. The bottom line is a single electrode pair and the next lines are, in order, 5, 10 and 15 electrode pairs.

Figure 12:
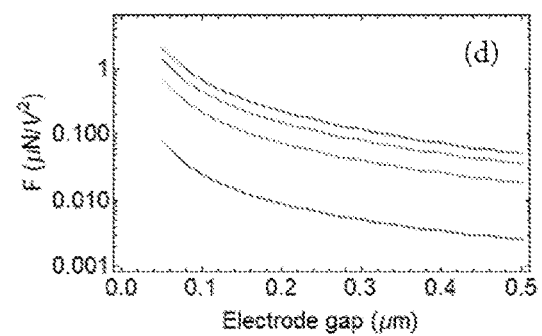
FIG. 12 is a plot of force per volt as a function of electrode gap for the arrangement of FIG. 10.

FIG. 12 shows the force per volt applied to the structure as a function of electrode gap for a single electrode pair (as shown in FIG. 1) and for 5, 10 and 15 pairs having a configuration similar to FIG. 9. FIG. 12 shows that the applied force increases with the number of inter-digitated electrode pairs.

By way of example, the design shown in FIG. 9 consists of 30 electrodes (15 electrode pairs) each of width 0.9 micron and separation of 150 nm patterned on the top surface of the microtoroid resonator. The capacitance calculated for this structure is 250 fF, which is more than 50 times larger than the design shown in FIG. 1.

Persons skilled in the art will understand that the invention is not limited to 1, 5, 10 or 15 pairs of electrodes but could be constructed with 2, 3, 4, 6, 7, 8, 9, 11, 12, 13, 14, 16 or more pairs of electrodes.

Referring to FIG. 13, there is shown an enhancement in capacitance and force applied to the structure of the device using several possible high dielectric coatings over the electrodes, including $SiO_2$, $TiO_2$, and BST ($Ba_{0.7}Sr_{0.3}TiO_3$ in a silica suspension). FIG. 14 and FIG. 15 show data similar to FIG. 11 and FIG. 12. In each case the bottom trace is the result for an air gap and is the same data as shown in FIG. 11 and FIG. 12. The other traces are, from bottom to top, $SiO_2$, $TiO_2$, and BST. A simulation of the electromagnetic energy density for each of the coatings are shown, respectively, from left to right in FIG. 13.

In the embodiments described above the optical cavity is formed on a silicon wafer and supported by a central silicon pedestal. The optical cavity is supported by an anchor, as shown in FIG. 5. FIG. 16(*a*) shows the simulated mechanical compliance for the single anchor configuration of FIG. 5. FIG. 16(*b*) shows the simulated mechanical compliance for a double anchor configuration with the anchors opposite and coaxial. FIG. 16(*c*) shows the simulated mechanical compliance for a four anchor configuration with the anchors in a cross configuration. The simulated mechanical compliance for a "no slot" configuration is shown in FIG. 16(*d*) for comparison. It is clear that the number of anchors impacts the mechanical compliance and therefore the ability to tune the optical cavity. The inventors speculate that the width of the anchor will also have an effect. Various embodiments of the invention may have 1, 2, 3, 4 or more anchors.

In the embodiment described in FIG. 9, the slot is removed, so as to be able to position the electrodes closer to one another, to be able to combine multiple inter-digitated electrodes and to be able deposit a dielectric coating over the electrodes. All of these contribute to strongly increase the device capacitance and force per applied volt, at the cost of a somewhat reduced mechanical compliance.

Figure 17:
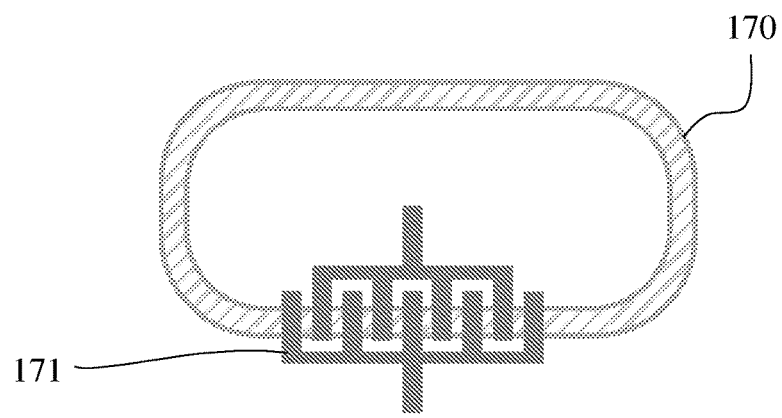
FIG. 17 shows a third embodiment of a tunable optical device.

Although the preferred embodiment has been described in terms of a microdisk optical cavity the invention is not limited to a particular configuration. A "racetrack" configuration is shown in FIG. 17. This optical resonator 170 may be fabricated on a silica wafer by, for example, femtosecond laser pulses in order to define a region of modified refractive index within the material, or a wet etch step with, for example, hydrofluoric acid or a reactive ion etching step in order to define the resonator boundaries of a waveguide. Planar electrodes, such as inter-digitated electrodes 171 are patterned over all, or a portion of, the cavity and may be covered with a high K dielectric coating (not shown) as described previously. The electrodes allow for strain tuning of the resonances by changing the length of the "racetrack".

Figure 18:
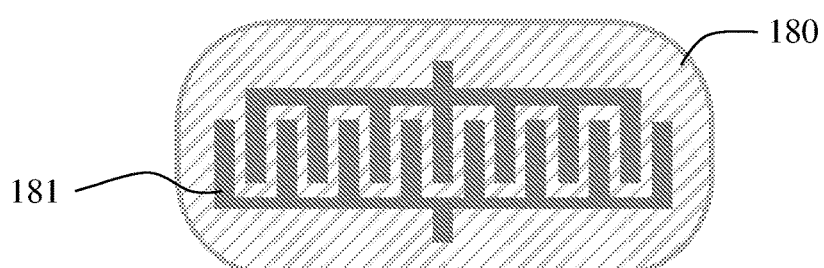
FIG. 18 shows a fourth embodiment of a tunable optical device.

Referring to FIG. 18, there is shown a circular or elliptic cavity 180 fabricated by, for example, a combination of selective or non selective chemical wet etches and/or dry reactive ion etching steps. The cavity can be fabricated out of a dielectric material (such as for example reflow or non reflown silica, chalcogenide and silicon nitride), or a semiconductor material such as Silicon, Gallium Arsenide, Aluminum Nitride, Silicon Carbide or Indium Phosphide. A planar inter-digitated capacitance 181 is patterned over all, or a portion of, the cavity, while avoiding the periphery where the optical mode is localized by total internal refraction. The cavity itself can be undercut in order to increase mechanical compliance, or can remain entirely bound to the substrate. The electrodes may or may not be embedded and may be covered with a high K dielectric coating (not shown), and allow for tuning of the resonances.

Figure 19:
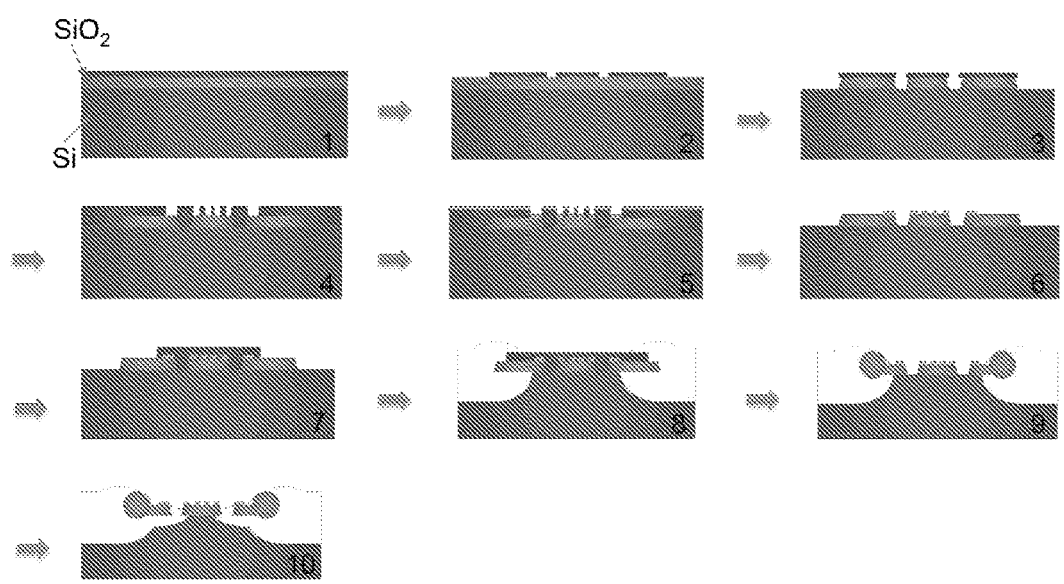
FIG. 19 shows a possible fabrication process for a tunable optical device

In order to fabricate a tunable optical device according to the embodiment of FIG. 1 the technique outlined in FIG. 19 may be followed. The optical cavity is fabricated using a combination of conventional photolithographic processes and a wet hydrofluoric acid based etch (Steps 1-3). Next, the electrodes are patterned on the cavity using conventional photolithographic processes, metal deposition and lift off (Steps 4-6). A third lithography step is required to cover the slotted portion of the cavity, in order to avoid unwanted etching of the device during the first of the two following underetch stages (Step 7). The optical resonator is underetched in two stages. The first under-etching stage is stopped before the material underneath the electrodes is etched away (Step 8) and heat is applied with a $CO_2$ laser to melt (reflow) the material of the optical cavity, enabling greatly enhanced optical properties (Step 9). The thermal conductivity of the material underneath the electrodes prevents the electrodes from heating and damage. The second under-etching stage frees the reflown outer part of the resonator from the material underneath so it can contract and expand upon application of a capacitive force (Step 10).

This invention proposes the use of capacitive forces to achieve tuning of an optical cavity. The use of capacitive force provides wide tuning range, high efficiency, and fast tuning. When a bias voltage is applied across two electrodes, the capacitive force between the electrodes compresses or extends the size of the device, shifting the frequencies of the optical resonances. The tunable optical device will find many applications including biological, nanoparticle, and magnetic field sensing; efficient radio to optical frequency conversion, optical routing and switching; on-chip precision clocks for GPS and other timing applications; and on-chip lasers, optical interconnects, and integrated optical delay lines for optical components in computation and communication.

The ability to produce very small devices on the micron scale permits a large number of devices to be produced on a single silicon wafer. By way of example, an array of 1000 by 1000 tunable optical cavities with a diameter of about 60 µm micron will fit on a single wafer of size 100 mm square (allowing for about 40 µm spacing between cavities). Semiconductor lasers may also be fabricated along the edges of the wafer and optical waveguides formed in the wafer from the lasers to the optical cavities. It will be understood that this produces 1000000 addressed optical devices.

The invention claimed is:

1. A tunable optical device comprising: an optical ring cavity in which optical radiation circulates and having at least an optical resonance frequency; and electrodes applied to the optical ring cavity forming a capacitor;
   wherein the electrodes are concentric in a horizontal plane and have a pair of tabs to apply electric potential;
   wherein applying a potential difference between the electrodes through the pair of tabs generates a capacitive force that applies strain to the optical ring cavity that shifts the optical resonance frequency.

2. The tunable optical device of claim 1 wherein the electrodes are deposited onto the optical ring cavity or are deposited adjacent or in a slot formed in the optical ring cavity.

3. The tunable optical device of claim 1 wherein the optical ring cavity is selected from one of: a circular cavity; an elliptical cavity; a rectangular cavity; a square cavity.

4. The tunable optical device of claim 3 wherein the optical ring cavity has a largest dimension in the range of: about 5 microns to about 30 millimetres; or about 10 micron to about 0.5 millimetres; or about 60 micron to about 16 millimetres.

5. The tunable optical device of claim 1 wherein the electrodes are selected from: gold; aluminium; or indium tin oxide.

6. The tunable optical device of claim 1 comprising a single pair of electrodes.

7. The tunable optical device of claim 1 wherein the electrodes are deposited on a surface of the optical ring cavity.

8. The tunable optical device of claim 1 further comprising a slot formed in the optical ring cavity and wherein the electrodes are deposited adjacent or in the slot.

9. The tunable optical device of claim 8 wherein the electrodes are deposited in the slot and extend beyond the extent of the slot.

10. The tunable optical device of claim 8 comprising a single anchor across the slot.

11. The tunable optical device of claim 8 comprising two anchors across the slot.

12. The tunable optical device of claim 8 comprising three or more anchors across the slot.

13. The tunable optical device of claim 1 further comprising a power supply applying an AC potential difference with a DC bias to the electrodes.

14. The tunable optical device of claim 13 wherein the DC offset is about 200 V and the AC is about 5 Vpp.

* * * * *